United States Patent [19]

Hattori

[11] Patent Number: 4,990,976
[45] Date of Patent: Feb. 5, 1991

[54] SEMICONDUCTOR DEVICE INCLUDING A FIELD EFFECT TRANSISTOR HAVING A PROTECTIVE DIODE BETWEEN SOURCE AND DRAIN THEREOF

[75] Inventor: Masayuki Hattori, Tokyo, Japan
[73] Assignee: NEC Corporation, Japan
[21] Appl. No.: 274,918
[22] Filed: Nov. 22, 1988

[30] Foreign Application Priority Data

Nov. 24, 1987 [JP] Japan .................. 62-297011

[51] Int. Cl.⁵ .............. H01L 29/10; H01L 29/78
[52] U.S. Cl. .................. 357/23.4; 357/23.8; 357/13; 357/20; 357/86
[58] Field of Search .............. 357/23.13, 23.4, 48, 357/20, 23.8, 13, , 38, 86

[56] References Cited

U.S. PATENT DOCUMENTS 4,100,561 7/1978 Ollendorf .................. 357/13
4,145,703 3/1979 Blanchard .................. 357/23.4

FOREIGN PATENT DOCUMENTS 54-8474 of 0000 Japan .................. 357/23.13
59-98557 6/1984 Japan .
61-3469 1/1986 Japan .................. 357/13
62-102555 5/1987 Japan .

OTHER PUBLICATIONS

Sze "Physics of Semiconductor Dev.", pp. 494-495, (1981).

Primary Examiner—Andrew J. James
Assistant Examiner—Sara W. Crane
Attorney, Agent, or Firm—Laff, Whitesel, Conte & Saret

[57] ABSTRACT

A field effect transistor includes an N-type semiconductor substrate of a drain region, a P-type base region formed in a surface of the semiconductor substrate, an N-type source region formed in the base region, a gate electrode formed on a base region between the source region and the semiconductor substrate, an N-type region having higher impurity concentration than the semiconductor substrate and formed in the surfaces of both the P-type base region and the N-type semiconductor substrate for forming a Zener diode between source and drain, a source electrode formed on the surface and connected to the source and base region, and a drain electrode connected to the semiconductor substrate. The N-type region for forming a Zener diode is formed by an ion implantation method.

9 Claims, 6 Drawing Sheets

SEMICONDUCTOR DEVICE INCLUDING A FIELD EFFECT TRANSISTOR HAVING A PROTECTIVE DIODE BETWEEN SOURCE AND DRAIN THEREOF

BACKGROUND OF THE INVENTION

1. Field of the Invention

The present invention relates to a semiconductor device, and more particularly, to a semiconductor device containing a field effect transistor equipped with a protective diode.

2. Description of the Related Art

On the semiconductor devices of this kind, there has been proposed a semiconductor device including a vertical-type field effect transistor equipped with a protective Zener diode formed commonly in a semiconductor substrate, as disclosed in Japanese Patent Laid-Open No. 98557/1984. FIG. 1 is a sectional view of this conventional semiconductor device. In this vertical-type field effect transistor, a drain electrode 9" is formed on the lower surface of a semiconductor substrate 4" consisting of an N+-type layer 21" and an N-type drain region 22" formed on this N+-type substrate 21". In the N-type drain region 22", a plurality of P-type base regions 3" are formed with a predetermined space between them by diffusion from the upper surface of the semiconductor substrate 4". In each P-type base region 3", an N+-type source regions 10" are formed by impurity diffusion from the surface side, and a P+-type base contact diffused region 11" is formed in the N+-source region 10". On a surface portion 22a" of the N-type drain region 22" between the P-type base regions 3" and on the surfaces of the P-type base region 3" and the source region 10", a gate polysilicon electrode 5" is formed with a gate oxide film 6" interlaid between them. A source electrode 8" is formed on the substrate 4" to contact with both the source region 10" and the P+-base contact diffused region 11", while an interlayer insulation film 12" is formed between this source electrode 8" and the gate electrode 5". In this way, the vertical-type field effect transistor having the source electrode 8", the N+-source region 10", the P-type base region 3", the N-type drain region 22", the N+-type drain region 21" and the drain electrode 9" is formed.

Furthermore, the bottom part of the P-type base region 3" is so formed as to contact with the N+-drain layer 21", to form a Zener diode at the bottom part of each base region 3". Therefore, the Zener diode having a lower breakdown voltage than that determined by the drain region 22" and the base region 3" is formed between the source and the drain, and a breakdown resistance between the source and the drain of the vertical-type field effect transistor is increased. Additionally, numeral 14" denotes a field thermal oxide film.

An equivalent circuit of the semiconductor device of this prior art has a construction wherein a Zener diode $D_Z$ for protection is connected between the drain D and the source S of FET 30 as shown in FIG. 2.

Although the above-described prior art may be realized with relative ease in the vertical-type field effect transistor, it is hard to apply this device structure to a horizontal-type field effect transistor. Moreover, in order to alter the voltage of the Zener diode in the prior art, it is necessary to alter the impurity concentration of the P-type base region 3". However, since the channel region of the prior-art field effect transistor is formed on the surface of this P-type base region 3", a threshold voltage $V_T$ of the field effect transistor is also altered when the impurity concentration of this base region 3" is altered. Therefore, it has been difficult to alter the voltage of the Zener diode without changing the threshold voltage $V_T$ according to the prior art.

As for the horizontal-type field effect transistor, it is conceivable to form a Zener diode in a semiconductor substrate separately from the horizontal-type field effect transistor and connect them as shown in FIG. 3.

In this structure, N-type wells 52" and 56" are provided in a P-type semiconductor substrate 51". A P-type base 53", an N-type high impurity concentration source 54" and an N-type high impurity concentration impurity regions 55" are formed in the surface portion of the well 52". A gate 58" is formed at least on a channel-forming region of the base 53" with a gate insulation film interlaid therebetween. A P-type high impurity concentration region 53a" and an N-type high impurity concentration region 55" are provided in the surface portion of the well 56". A source electrode 59s" is connected to the P-type high impurity concentration region 53a" in the well 56", the source 54" and base 53". A drain electrode 59d" is connected to a drain contact region 55" in the well 52" and the N-type high impurity concentration region 55" in the well 56". Herein the N-type well 56" and the P-type high impurity concentration regions 53a" constitute a Zener diode for protection, for which the former operates as a cathode and the latter as an anode.

Accordingly, an equivalent circuit of this semiconductor device also has a construction wherein a Zener diode $D_Z$ for protection is connected between the drain D and the source S of FET 30 as shown in FIG. 2.

Since the Zener diode for protection against a surge and the horizontal-type field effect transistor are formed separately on the same semiconductor substrate 51" in the semiconductor device described above, the area occupied by those diode and transistor is increased when the current capacity of the Zener diode is made large sufficiently. This obstructs the attainment of high density of the device, and makes the structure complicated to result in a fault of tending to cause an unstable operation, such as latch-up.

SUMMARY OF THE INVENTION

It is, therefore, a primary object of the present invention to provide a semiconductor device having a field effect transistor and a protective diode thereof in the same chip, in which the breakdown voltage of the protective diode can be altered without changing the threshold voltage of the field effect transistor.

It is another object of the present invention to provide a semiconductor device in which a protective Zener diode and a field effect transistor are formed in the same semiconductor substrate with small occupation area.

It is still another object of the present invention to provide a semiconductor device in which a protective Zener diode and a field effect are formed in the same semiconductor substrate with a device structure to prevent the device from latch-up.

The semiconductor device in accordance with the present invention includes a semiconductor substrate of one conductivity type, a first semiconductor region of the other conductivity type formed in a main surface of the semiconductor substrate, a second semiconductor region of the one conductivity type formed in the first semiconductor region, a gate electrode formed on a portion of the first semiconductor region between the second semiconductor region and the semiconductor substrate, a third semiconductor region of the one conductivity type having higher impurity concentration than the semiconductor substrate and formed in the main surface of the first semiconductor region with the third semiconductor region in contact with the semiconductor substrate, a first electrode formed on the main surface to connect the first and second semiconductor regions, and a second electrode connected to the semiconductor substrate.

The semiconductor substrate operates as a drain region and the first semiconductor region, as a base region. Since the first semiconductor region of the base region is connected to the source region by the first electrode and the third semiconductor region is formed in contact with the semiconductor substrate of the drain region, a protective Zener diode is formed between the source and drain by using the first semiconductor region and the third semiconductor region. Since the third semiconductor region is formed in the first semiconductor region of the base region, and can be formed in the outside periphery portion of the first semiconductor region surrounding the gate electrode, a protective Zener diode having a large current capacity can be formed without increasing the device area.

Since the third semiconductor region for a protective Zener diode is formed on the main surface, this third semiconductor region can be formed independently of the first semiconductor region of the base region. Therefore, the breakdown voltage of the Zener diode can be altered without changing the threshold voltage of the field effect transistor.

Moreover, since only the third semiconductor region is added to form the protective Zener diode, the structure of the device is simple and the latch-up can be prevented.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENT

Figure 4:
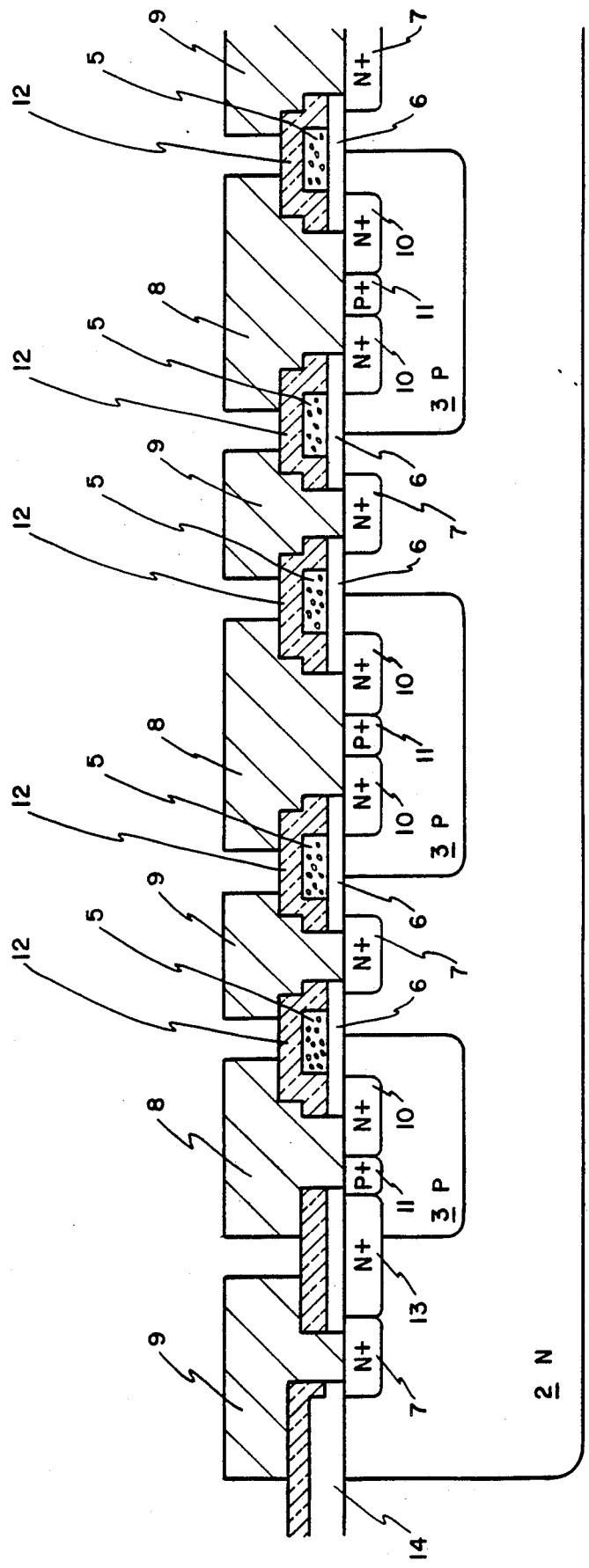
FIG. 4 is a sectional view for explaining a first embodiment of the present invention.

Referring to FIG. 4, a drain region of an N-type well 2 is formed in a P-type semiconductor substrate 1. A P-type base 3, an N-type high impurity concentration source 10 and a P-type high impurity concentration region 11 are formed in the surface portion of the N-well 2. A gate electrode 5 is formed on the surface of the N-well 2, with a gate insulation film 6 interlaid between them. An N-type high impurity concentration region 13 is also formed to operate as a cathode of a protective Zener diode having the base 3 as its anode. The base 3 and the source 10 are connected together by a source electrode 8, while the drain region of the N-type well 2 and the impurity region 13 operating as the cathode of the Zener diode are connected to a drain electrode 9 through an N+ impurity region 7. Additionally, Numerals 12 and 14 denote an interlayer insulator film and a field thermal oxide film, respectively.

Next, further description will be made with numerical values, citing a horizontal field effect transistor with a source-drain withstand voltage of 25 V and a current capacity of 1 A.

Figure 5:
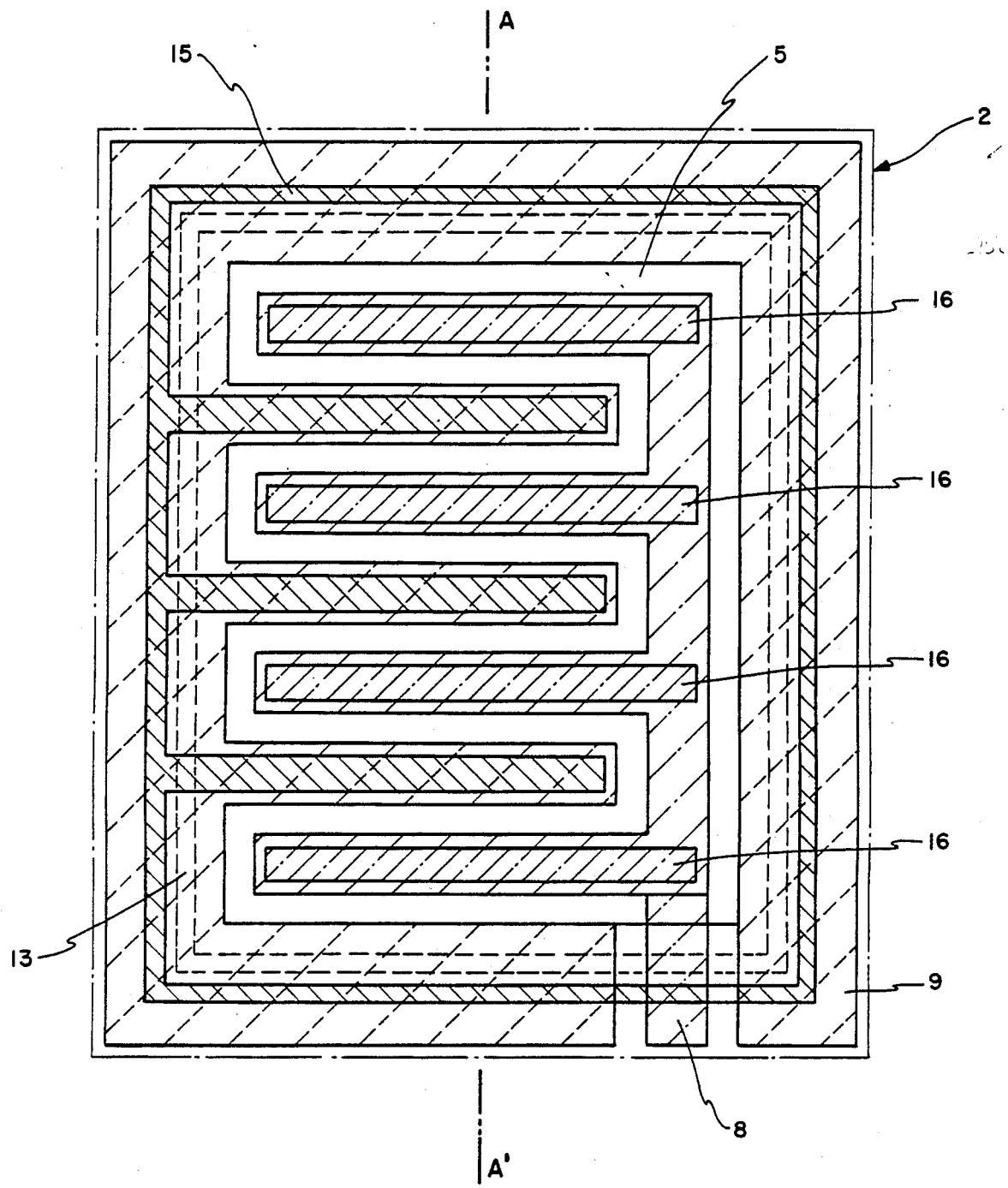
FIG. 5 is a plan view of FIG. 4, FIG. 4 being taken along the line A—A' of FIG. 5.

The P-type substrate 1 has a resistivity of about 11.0 to 15.0 $\Omega$cm. The N-type well region 2 is formed by diffusion from the surface of the substrate 1. The well region 2 is about 6 $\mu$m deep, the surface concentration thereof being 2 to $4\times10^{16}$ atms/cm$^2$. The base region 3 is about 2.5 $\mu$m deep, the surface concentration thereof being 5 to $8\times10^{17}$ atms/cm$^2$. The threshold voltage $V_T$ of the transistor is controlled by the surface concentration of this base region 3. Both the source region 10 and the P-type high impurity concentration region 11 are about 1.0 $\mu$m deep, the surface concentration thereof being about $1\times10^{20}$ atms/cm$^2$. The N-type high impurity concentration region 7 of the drain region is formed simultaneously with the source 10. The concentration of the region 13, which determines a Zener voltage, can be controlled accurately by an ion implantation method. In the case of a withstand voltage of 25 V, the region 13 is formed with an acceleration voltage of 50 keV and a dose of $2\times10^{13}$ cm$^{-2}$, the depth being about 2 $\mu$m, and the surface concentration being controlled to be about $1\times10^{17}$ atm/cm$^2$. As for the dimension in the lateral direction, the gate electrode 5 is 10 $\mu$m wide and spaced from one another by 15 $\mu$m. The dimensions of a contact hole are 10 $\mu$m on the source side and 6 $\mu$m on the drain side, while an aluminum electrode has a width of 10 $\mu$m on the drain side and of 15 $\mu$m on the source side. FIG. 5 is a plan view of the present embodiment. Each region corresponds to that of FIG. 4. The high impurity concentration region 13 for forming the Zener diode is so formed as to surround the gate electrode 5. The width of about 5 to 10 $\mu$m is sufficient for this region, and the formation of this region does not need an additional device element area. This is because the Zener diode can be formed between the source and the drain by utilizing a region which is necessitated for spacing the high impurity concentration region 7 and the base region 3 by 10 $\mu$m or more so as to allow a sufficient value of current. In this figure, numeral 15 represents a drain contact region and 16 a source contact region, and other numerals correspond to those of the regions of FIG. 4, respectively.

Figure 6:
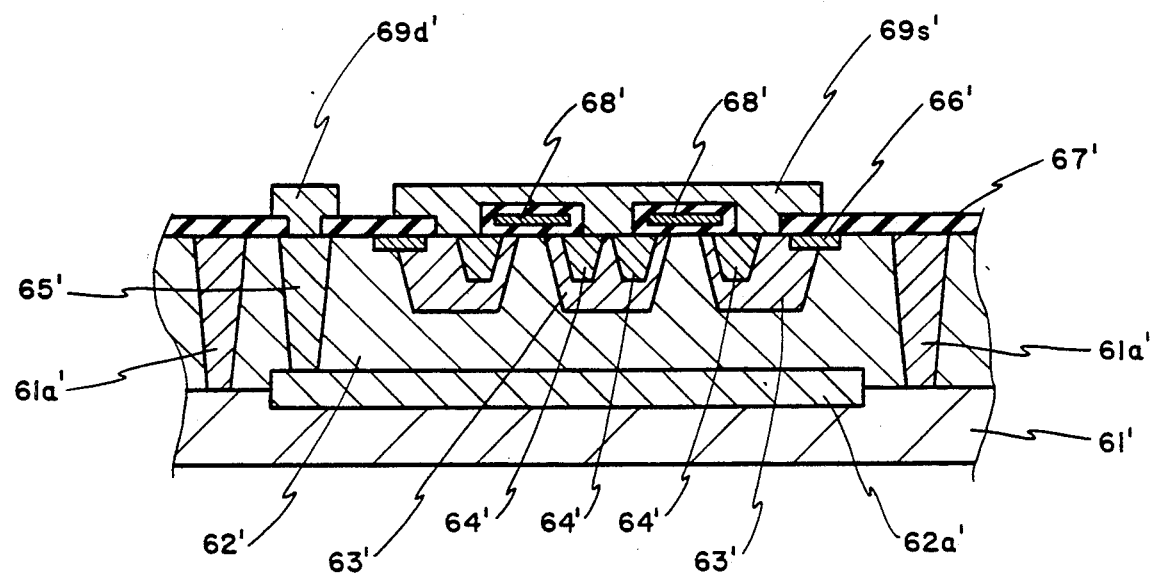
FIG. 6 is a sectional view for explaining a second embodiment of the present invention.

Referring to FIG. 6, a drain region of an N-type epitaxial layer 62' is formed on an N-type high impurity concentration buried region 62a' buried on the P-type semiconductor substrate 61' with the epitaxial layer 62' isolated by an element isolation region 61a'. A drain lead-out region of an N-type high impurity concentration region 65' is formed extending from the buried layer 62a' to the surface of the epitaxial layer 62'. A P-type base 63', an N-type high impurity concentration source 64' and a cathode of a Zener diode of an N-type high impurity concentration regions 66' are formed on the surface of the epitaxial layer 62'. A gate 68' is formed on the epitaxial layer 62' with the gate insulation film between them. A source electrode 69s' connecting the source 64' and the base 63' together and a drain electrode 69d' connected to the impurity region 65' are provided.

Figure 7:
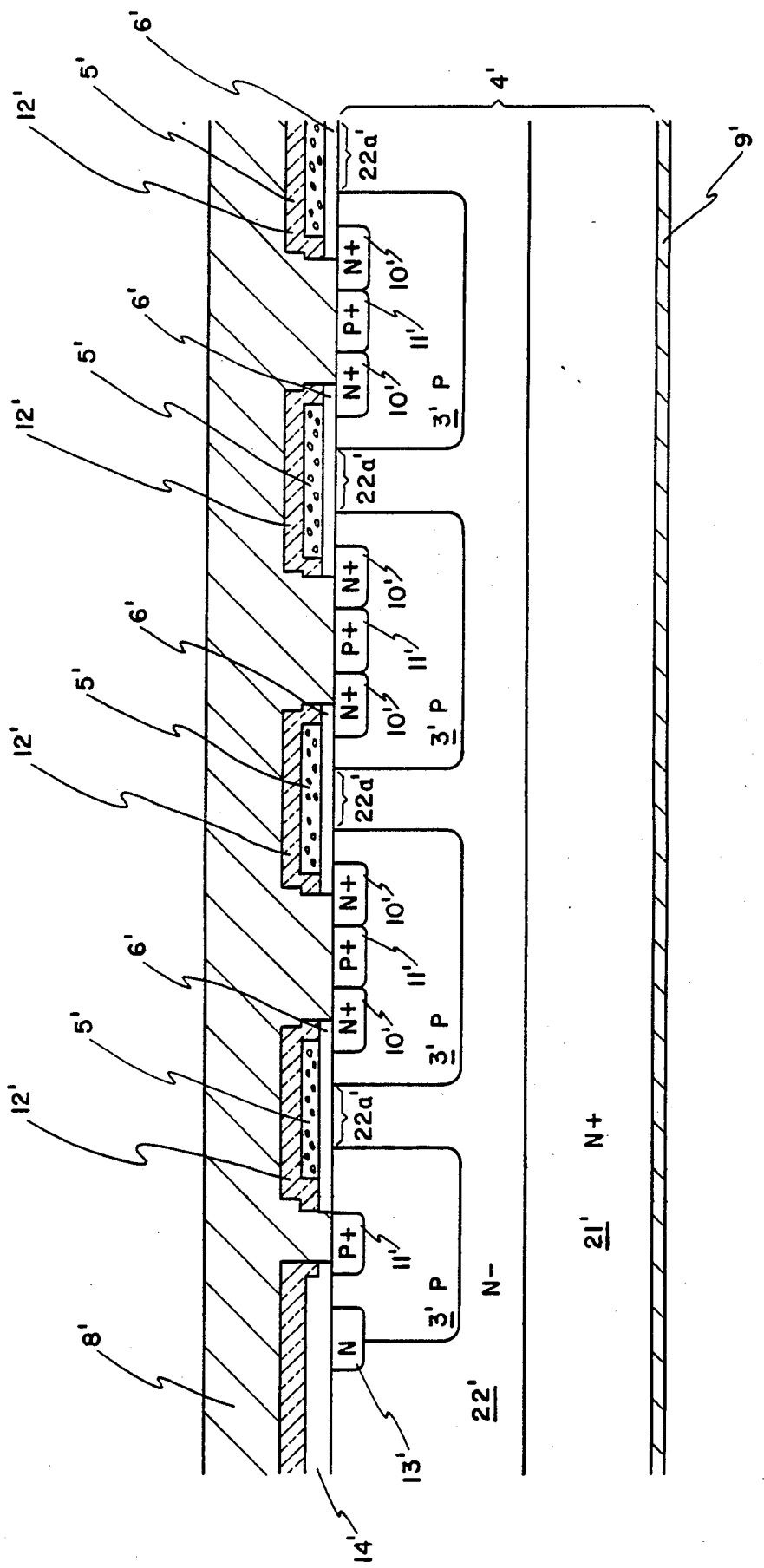
FIG. 7 is a sectional view for explaining a third embodiment of the present invention.

Referring to FIG. 7, the present invention is applied to a vertical type field effect transistor. A semiconductor substrate 4' consists of an N+-type substrate 21' and an N-type drain region 22' formed on the N+-type substrate 21'. A drain electrode 9' is formed on the lower surface of this substrate 4', while a P-type base region 3', an N+-type source region 10', and a gate polysilicon electrode 5' and a source aluminum electrode 8', are formed in the upper surface thereof. Numeral 12' represents an interlayer insulation film, and 11' a high-concentration P+-type base region. The characteristic feature of the present embodiment is that the impurity region 13' is provided, and a Zener diode is formed between a source and a drain by making the P-type base region 3' contact with an N-type impurity region 13'. In this embodiment as well, the voltage of the Zener diode can be controlled independent of the threshold voltage $V_T$ of the vertical field effect transistor by varying the concentration of the N-type impurity region 13'.

Figure 1:
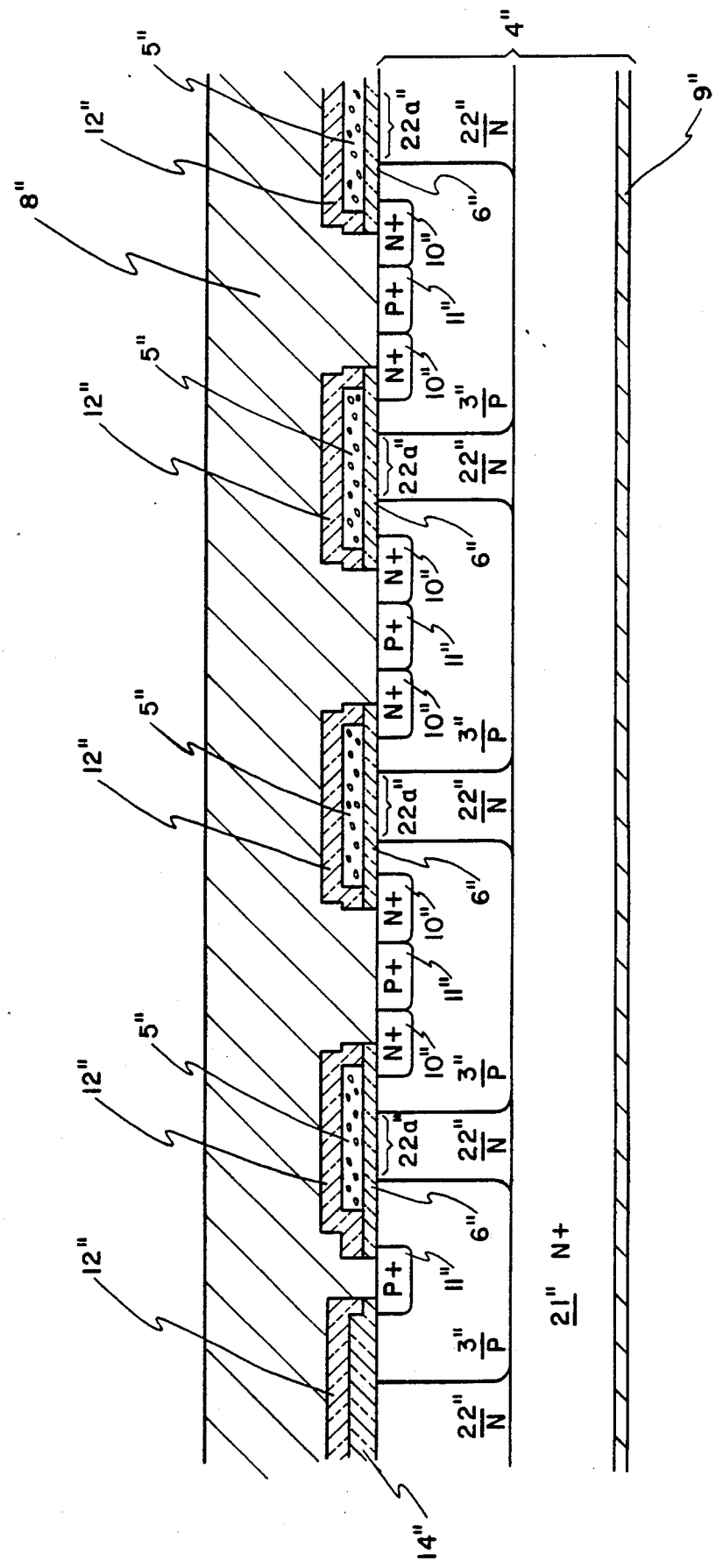
FIG. 1 is a sectional view of a semiconductor device in the prior art.
Figure 2:
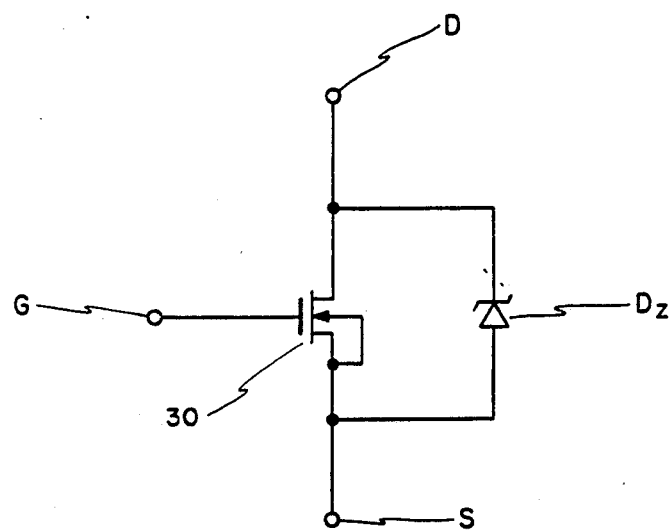
FIG. 2 is an equivalent circuit diagram for explaining the prior art and the present invention.
Figure 3:
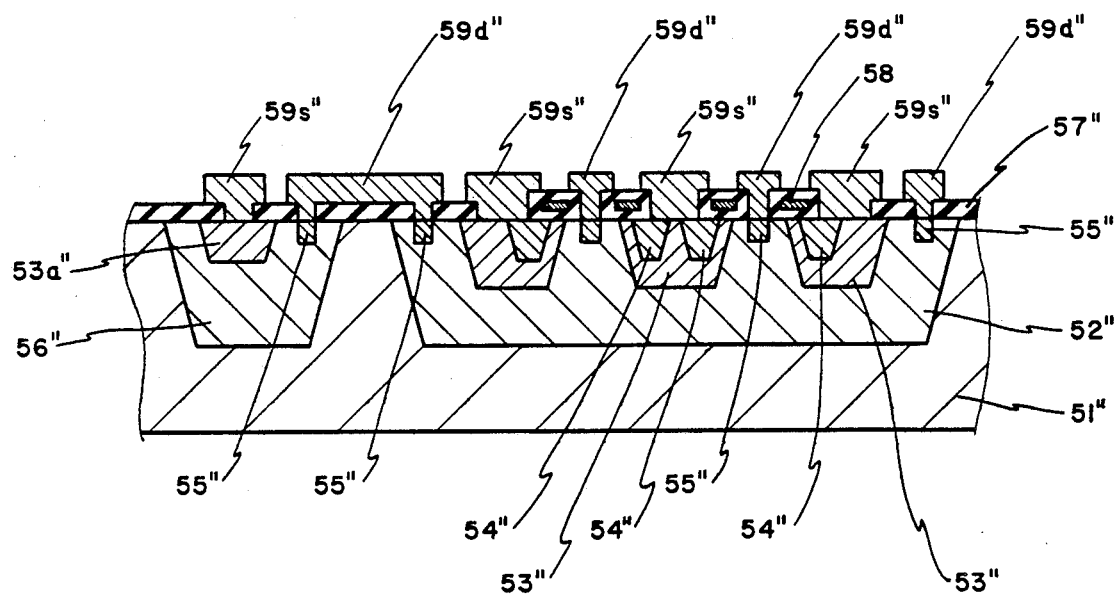
FIG. 3 is a sectional view for explaining a conceivable device structure in relation to the present invention.

An equivalent circuit of the semiconductor device of the first, second and third embodiments of the present invention also has a construction wherein a Zener diode $D_Z$ for protection is connected between the drain D and the source S of FET 30 as shown in FIG. 2.

Figure 8:
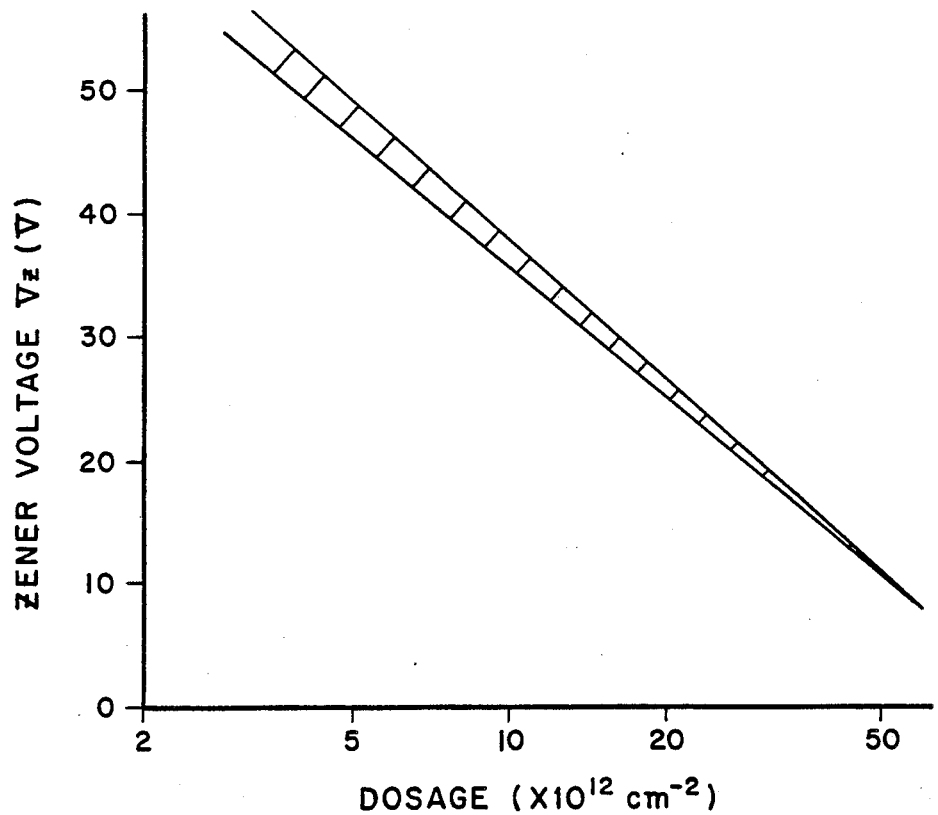
FIG. 8 is a graph showing a relationship between a dosage of an ion implantation and a Zener voltage of the semiconductor device according to the first, second and third embodiments of the present invention.

FIG. 8 is a characteristic graph showing the relationship between a dose of ion implantation and a Zener voltage when an ccceleration voltage is 100 keV. When the N-type impurity regions 13, 6' and 13' of the first, second and third embodiments are formed by the ion implantation method, accordingly, the Zener voltage can be set at a desired value on the basis of the relationship shown in FIG. 8.

What is claimed is:
1. A semiconductor device comprising;
   a semiconductor substrate of one conductivity type;
   a first semiconductor region of the other conductivity type formed in a main surface of said semiconductor substrate;
   a second semiconductor region of said one conductivity type formed in a surface of said first semiconductor region;
   a gate electrode formed on a portion of said first semiconductor region, said portion located between said second semiconductor region and said semiconductor substrate;
   a third semiconductor region of said one conductivity type formed in said main surface of said semiconductor substrate and said surface of said first semiconductor region, said third semiconductor region having higher impurity concentration than said semiconductor substrate and said third semiconductor region being in contact with both said semiconductor substrate and said first semiconductor region to form a Zener diode;
   a first electrode connected to said first and second semiconductor region; and
   a second electrode connected to said semiconductor substrate.

2. A semiconductor device as claimed in claim 1, wherein said semiconductor substrate is a drain region, said second semiconductor region being a source region and a Zener diode being formed between said source and drain by said third semiconductor region and said first semiconductor region.

3. A semiconductor device as claimed in claim 2, wherein said gate electrode is surrounded by said third semiconductor region.

4. A semiconductor device as claimed in claim 2, wherein said semiconductor device is a horizontal-type field effect transistor, said second electrode being formed on said main surface of said semiconductor substrate.

5. A semiconductor device as claimed in claim 2, wherein said semiconductor device is a vertical-type field effect transistor.

6. A field effect transistor comprising:
   a semiconductor substrate of a drain region, said semiconductor substrate being of one conductivity type;
   a base region of the other conductivity type formed in a main surface of said semiconductor substrate;
   a source region of said one conductivity type formed in a surface of said base region;
   a gate electrode formed on a portion of said base region, said portion being located between said source region and said semiconductor substrate;
   a semiconductor region of said one conductivity type formed in said main surface of said semiconductor substrate and in said surface of said base region, impurity concentration of said semiconductor region being higher than said semiconductor substrate and said semiconductor region being in touch with both said semiconductor substrate and said base region to form a Zener diode between said source and drain;
   a source electrode connected to both said source and base regions; and
   a drain electrode connected to said semiconductor substrate.

7. A field effect transistor as claimed in claim 6, wherein said gate electrode is surrounded by said semiconductor region.

8. A field effect transistor as claimed in claim 6, wherein said field effect transistor is a horizontal-type field effect transistor.

9. A field effect transistor as claimed in claim 6, wherein said field effect transistor is a vertical-type field effect transistor.

* * * * *